US006528188B1

(12) United States Patent
Suzuki et al.

(10) Patent No.: US 6,528,188 B1
(45) Date of Patent: Mar. 4, 2003

(54) ORGANIC EL ELEMENT FOR MULTI-COLOR EMISSION

(75) Inventors: Harumi Suzuki, Kariya (JP); Tetsuya Kato, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/662,922

(22) Filed: Sep. 15, 2000

(30) Foreign Application Priority Data

Sep. 16, 1999 (JP) .......................................... 11-262318
Jul. 28, 2000 (JP) ...................................... 2000-229009

(51) Int. Cl.[7] .............................................. H05B 33/00
(52) U.S. Cl. ...................... 428/690; 428/917; 313/502; 313/503; 313/504; 313/506
(58) Field of Search ................................ 428/690, 917; 313/502–504, 506

(56) References Cited

U.S. PATENT DOCUMENTS

| 5,093,698 A | 3/1992 | Egusa |
| 5,294,810 A | 3/1994 | Egusa et al. |
| 5,343,050 A | 8/1994 | Egusa et al. |
| 5,536,949 A | 7/1996 | Hosokawa et al. |
| 5,601,903 A | 2/1997 | Fujii et al. |
| 5,668,438 A | 9/1997 | Shi et al. |
| 5,837,391 A | 11/1998 | Utsugi |
| 5,858,562 A | 1/1999 | Utsugi et al. |
| 5,908,581 A | 6/1999 | Chen et al. |
| 6,124,046 A | 9/2000 | Jin et al. |

FOREIGN PATENT DOCUMENTS

| EP | 0857007 A1 | 8/1998 |
| JP | A-4-297076 | 10/1992 |
| JP | A-6-158038 | 6/1994 |
| JP | A-6-207170 | 7/1994 |
| JP | A-7-142169 | 6/1995 |
| JP | A-7-220871 | 8/1995 |
| JP | 8-78163 | 3/1996 |
| JP | A-10-3990 | 1/1998 |

OTHER PUBLICATIONS

U. S. patent application Ser. No. 09/414,823, Suzuki et al., filed Oct. 1999.
Hori, Negoro and Uchiike, "Optical Emission Mechanism of Organic EL Doped with Dye," *Gekkan Display*, Apr. 1, 1998.
Yoshiharu Satoh, Organic EL Devices Emitting White Light, *Organic EL Display—From Basic to Latest Information*, Oct. 20, 1998, pp. 87–92.
Yamamoto, "High Quality Display of TDK Organic EL Display," *Intensive Verification of Organic EL Display*, Electronic Journal 6th FPD Seminar, Jun. 29, 1999, pp. 31–48.

*Primary Examiner*—Bruce H. Hess
*Assistant Examiner*—Dawn Garrett
(74) *Attorney, Agent, or Firm*—Law Offices of David G. Posz (57) ABSTRACT

An organic EL element includes a luminescent layer containing an organic compound and sandwiched between an anode and a cathode. The luminescent layer is composed of a hole-transporting luminescent layer and an electron-transporting luminescent layer. Both luminescent layers emit light simultaneously. Each of the hole-transporting luminescent layer and the electron-transporting luminescent layer includes two or more kinds of fluorescent materials so that the emission spectrum from the hole-transporting luminescent layer 4a substantially confirms the emission spectrum from of the electron-transporting luminescent layer.

13 Claims, 10 Drawing Sheets

α-NPD

DCM1

PERYLENE

DCJTB

ORGANIC EL ELEMENT FOR MULTI-COLOR EMISSION

CROSS REFERENCE TO RELATED APPLICATIONS

This application is based upon and claims the benefit of Japanese Patent Applications No. 11-262318 filed on Sep. 16, 1999, and No. 2000-229009 filed on Jul. 28, 2000, the contents of which are incorporated herein by reference.

BACKGROUND OF THE INVENTION

1. Field of the Invention

This invention relates to an organic electroluminescent (EL) element having a laminate structure of two luminescent layers each containing an organic compound, and sandwiched between a pair of electrodes functioning as an anode and a cathode, for causing the two luminescent layers to emit light simultaneously so as to execute multi-color emission.

2. Description of the Related Art

Japanese Patent Laid-Open No. 8-78163 describes an organic EL element for multi-color emission by causing two luminescent layers to emit light simultaneously, as the organic EL element of the kind described above (hereinafter referred to as a laminated luminescent layer type) for executing multi-color emission. The organic EL element has a structure in which a hole-transporting luminescent layer (positioned on the anode side) and an electron-transporting luminescent layer (positioned on the cathode side) having mutually different emission colors are laminated with a carrier recombination region control layer (carrier block layer) interposed therebetween.

In this laminated luminescent layer type, multi-color emission is achieved when the hole-transporting luminescent layer and the electron-transporting luminescent layer emit light simultaneously, and the luminescent color (mixed color) obtained by synthesizing both light emissions becomes white.

The hole-transporting luminescent layer and the electron-transporting luminescent layer include, as a base material, a hole-transporting material and an electron-transporting material, respectively, each of which contains a fluorescent material (dopant) having a different luminescent color. Incidentally, the organic EL element uses generally those materials that are fluorescent under the solid state for both of the base material and the dopant.

The laminated luminescent layer type EL element relies on the following multi-color emission mechanism. Holes are injected into the hole-transporting luminescent layer and electrons are injected into the electron-transporting luminescent layer from the electrodes (anode and cathode). The holes and electrodes are recombined to produce excitons inside both luminescent layers through the carrier recombination region control layer interposed between the luminescent layers. The excitons impart energy to each base material or to each fluorescent material, and light is emitted.

Here, the carrier recombination region control layer has a hole blocking property, and can control migration of carriers (holes/electrons) between both luminescent layers to set the recombination region of carriers to one, or both, of the luminescent layers by changing its thickness. Therefore, when the carrier recombination region control layer has a suitable thickness, the luminescent layers having mutually different luminescent colors emit light simultaneously to achieve multi-color emission.

As a result of studies, however, it is revealed that the laminated luminescent layer type organic EL element has the following problems. One of the problems is that the luminescent color changes delicately in accordance with a quantity of current applied to the luminescent layers. This problem will be described with reference to FIGS. 13A and 13B.

Figure 13A:
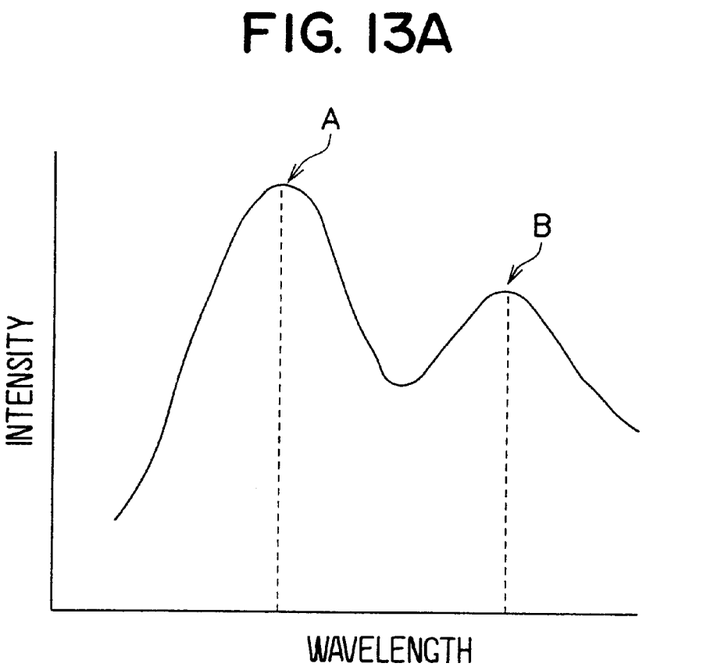
FIGS. 13A and 13B are explanatory views showing a chromaticity change of luminescent color in a laminated luminescent type organic EL element.
Figure 13B:
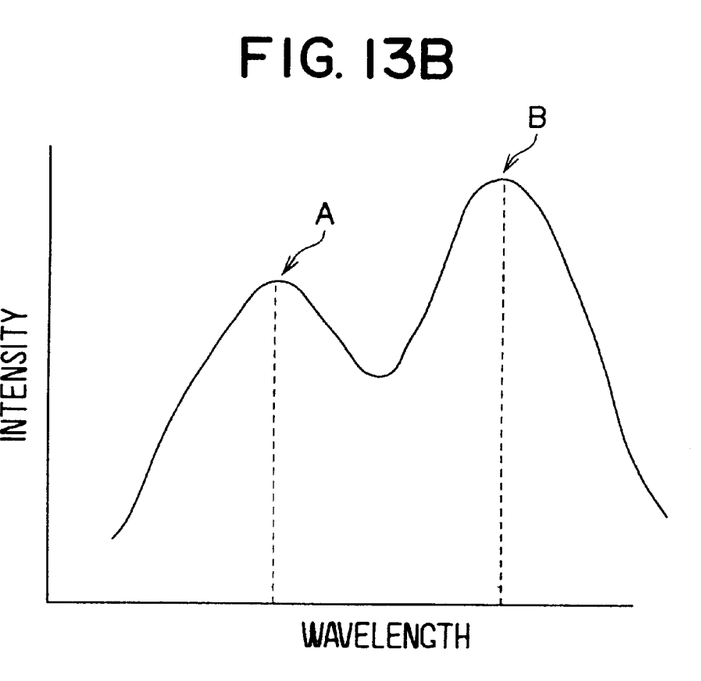

When the EL element is used while luminescent brightness is changed, such as when brightness is changed depending on the environment of use such as daytime and night, the current value applied to the luminescent layers is also changed. In FIGS. 13A and 13B, symbol A indicates the fluorescent peak of the fluorescent material of the hole-transporting luminescent layer, and symbol B does the fluorescent peak of the fluorescent material of the electron-transporting luminescent layer.

As shown in FIG. 13A, it is assumed, for example, that a mixed color can be obtained under the state where the peak A has a high intensity while the other peak B has a low intensity at a high current value (e.g. 100 mA/cm$^2$). When the current value applied to the luminescent layers is decreased (to 1 mA/cm$^2$, for example), the intensities of the peaks A and B become reverse as shown in FIG. 13B with the result that chromaticity of the mixed color by the luminescent layers changes.

The cause may presumably be as follows. When the current value changes, the supply balance of electrons and holes collapses due to the difference in energy level between the base material and the fluorescent material. The hole-transporting luminescent layer and the electron-transporting luminescent layer have different recombination quantities of electrons and holes. Eventually, the luminescence quantity changes in each luminescent layer.

The second problem is that even when a constant DC current is applied and light emission is continued, chromaticity of the luminescent color delicately changes with time. This can be explained presumably as follows. The organic materials that constitute the luminescent layers are decomposed by the application of the current and by light emission in the course of a long time (10,000 hours, for example), and they form any barrier between the hole-transporting luminescent layer and the electron-transporting luminescent layer.

The supply balance of electrons and the holes collapses due to the presence of this barrier and eventually, the luminescence quantity in each layer changes, the same peak change phenomenon as the change shown in FIGS. 13A and 13B occurs, and chromaticity changes.

SUMMARY OF THE INVENTION

The present invention has been made in view of the above problems. An object of the present invention is to prevent a change in chromaticity resulting from a change in current value and light emission time in a laminated luminescent layer type organic EL element.

According to the present invention, an organic luminescent layer of an organic EL element is composed of a hole-transporting luminescent layer made of a hole-transporting material as a base material doped with a first fluorescent material and an electron-transporting luminescent layer made of an electron-transporting material as a base material doped with a second fluorescent material. Each of the first fluorescent material and the second fluorescent material includes at least two kinds of fluorescent materials so that an emission spectrum emitted from the hole-transporting luminescent layer approximately confirms with an emission spectrum emitted from the electron-transporting luminescent layer.

The hole-transporting luminescent layer and the electron-transporting luminescent layer emit light simultaneously and the light has a mixed color as a synthesized color from the luminescent layers. Because the emission spectrum from the hole-transporting luminescent layer approximately confirms with that from the electron-transporting luminescent layer, chromaticity is hardly changed by a change in current value and light emission time.

Preferably, in each of the hole-transporting luminescent layer and the electron-transporting luminescent layer, each florescent peak wavelength of the fluorescent materials under a solid state is approximately equal to or longer than that of the base material.

Energy of excitons produced by recombination of holes and electrons in each luminescent layer depends on the energy gap of the base material of the luminescent layer. The energy gap depends on the fluorescent peak wavelength of the base material under the solid state, and is increased as the wavelength is decreased (that is, in order of red→green→blue).

In the present invention, because the fluorescent peak wavelength of the base material is approximately equal to or shorter than those of the fluorescent materials, the energy of the base material is larger than that of the fluorescent materials. Therefore, the energy of excitons is easily transmitted from the base material to the fluorescent materials, and simultaneous light emission of the fluorescent materials in the luminescent layers can be performed effectively.

Preferably, the hole-transporting luminescent layer directly contacts the electron-transporting luminescent layer, and fluorescent peak wavelengths of the luminescent layers are in a range of 380 nm to less than 510 nm. Accordingly, holes and electrons easily recombine with each other in the luminescent layers, and simultaneous light emission can be realized easily.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

Hereinafter, a preferred embodiment of the present invention will be explained with reference to the accompanying drawings. Incidentally, the present invention is applied to an EL element for effecting light emission of a mixed color as a synthesized luminescent color by simultaneous emission from both luminescent layers. The EL element has a structure in which a hole-transporting luminescent layer and an electron-transporting luminescent layer keep direct contact with each other.

Figure 1:
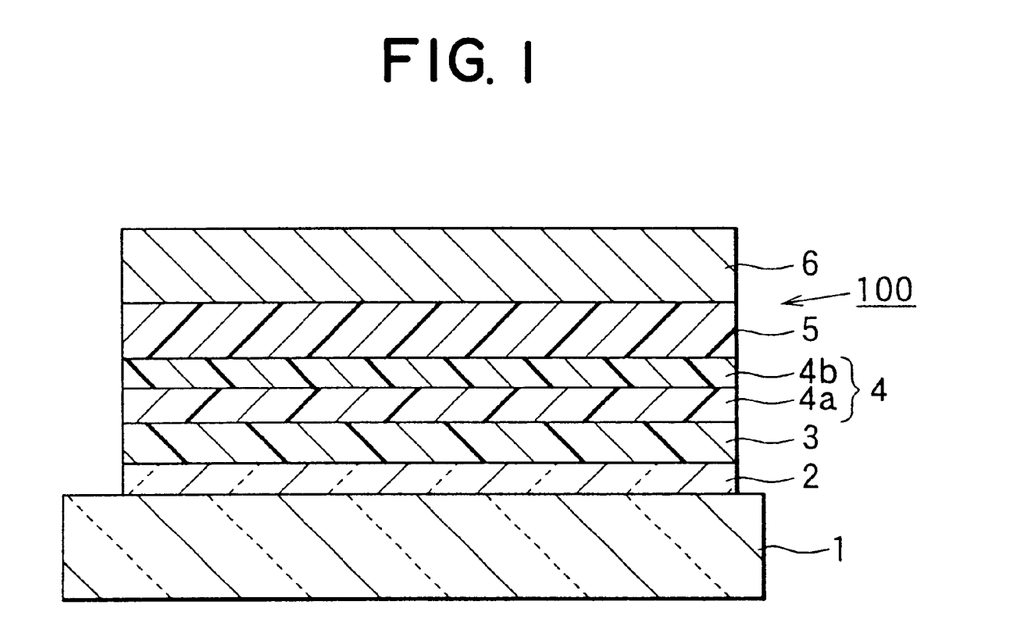
FIG. 1 is a cross-sectional view showing an EL element in a preferred embodiment of the present invention.

FIG. 1 shows the sectional structure of the EL element 100 according to this embodiment. Main skeletons of typical materials used in this embodiment will be explained with reference to FIGS. 2 to 4, though they are known in the art.

Referring first to FIG. 1, the EL element 100 has a substrate 1 having transparency to visible rays of light and made of glass, for example. An anode 2 comprising a conductor film having transparency is formed on one of the surfaces of the substrate 1. The anode 2 can be made of indium-tin oxide (ITO), for example, and has a thickness of about 100 nm to 1 $\mu$m, and preferably about 150 nm.

Figure 2:
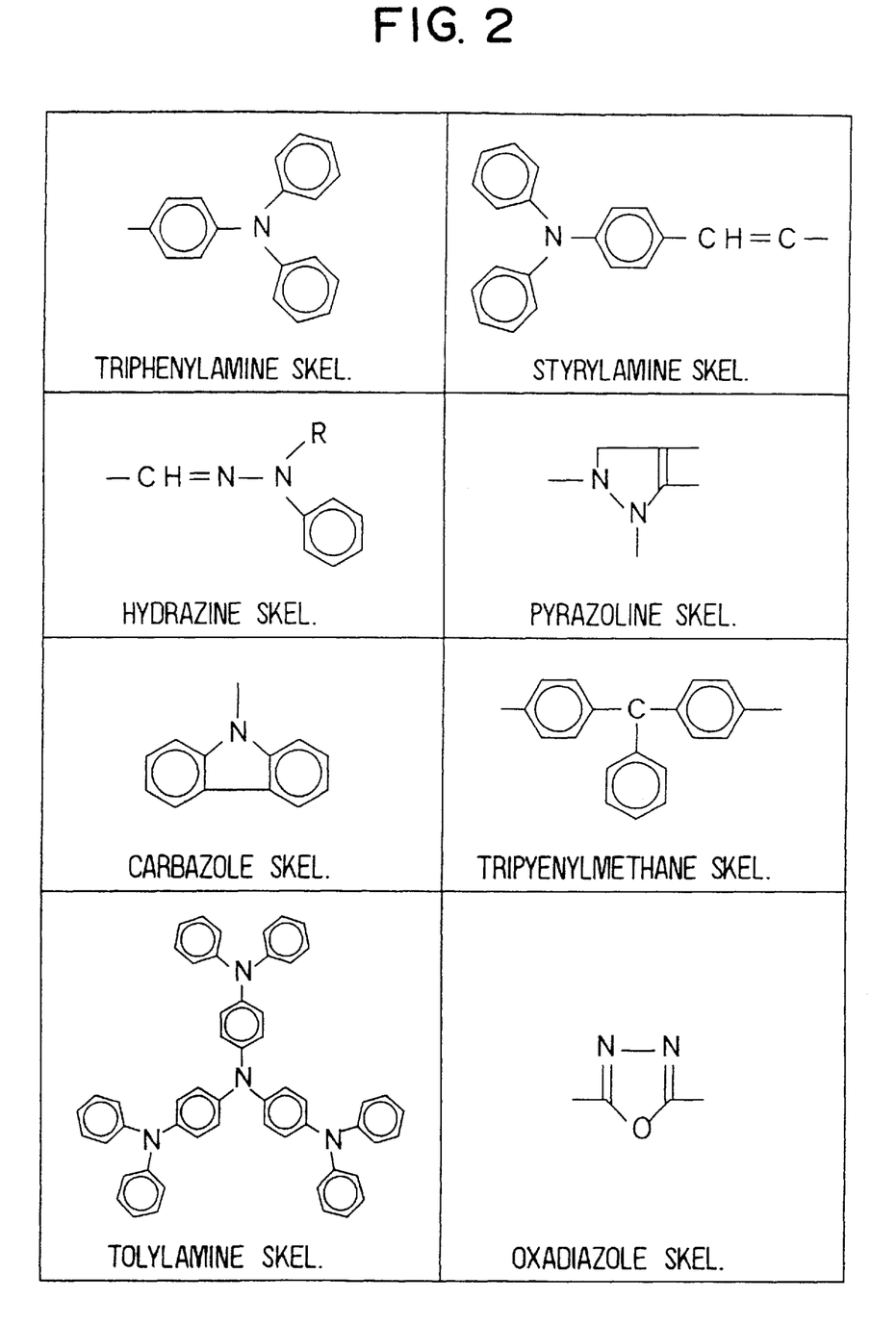
FIGS. 2 to 4 are diagrams showing main skeletons of materials used in the embodiment.

A hole injection layer 3 made of a hole-transporting (hole-injecting) organic material is disposed on the anode 2. The thickness of the layer 3 is about 10 nm to 100 nm, and preferably about 20 nm. This organic material needs to have the hole-transporting property but is not limited, in particular. Suitable examples are those organic materials which have a diphenyl skeleton, and as shown in FIG. 2, a triphenylamine skeleton, a styrylamine skeleton, a hydrazine skeleton, a pyrazoline skeleton, a carbazole skeleton, a triphenylmethane skeleton, a tolylamine skeleton, and an aromatic diamine skeleton (oxadiazole skeleton being shown).

A luminescent layer 4 is formed on the hole injection layer 3. The luminescent layer 4 has a total thickness of about 10 nm to 30 nm (preferably, about 20 nm), and has a laminated structure of a hole-transporting luminescent layer 4a containing a hole-transporting material as a base material (main material) and a fluorescent material (dopant), and positioned on the side of the anode 2, and an electron-transporting luminescent layer 4b containing an electron transporting material as a base material (main material) and a fluorescent material (dopant), and positioned on a side of a cathode 6. The electron transporting luminescent layer 4b contacts the hole-transporting luminescent layer 4a directly.

The hole-transporting material and the electron-transporting material as the base materials of the luminescent layers 4a and 4b have fluorescent peak wavelengths under the solid state in a range of 380 nm to less than 510 nm (blue wavelength region). The hole transporting material as the base material needs to have a valence band maximum level of at least −5.6 eV. Specific examples are those material which have the triphenylamine skeleton (see FIG. 2), the aromatic diamine derivatives, etc, having the hole-transporting property and exhibiting blue color fluorescence.

On the other hand, the electron-transporting material as the base material needs to have a conduction band minimum level of not higher than −2.7 eV. Specific examples are metal complexes such as benzo-oxadiazoleferrite-zinc complex (ZnBOX), distyrylbenzene derivatives and materials having the oxadiazole skeleton (see FIG. 3), and spiro-compounds, all of which have the electron-transporting property and exhibiting blue color fluorescence.

In this embodiment, the fluorescent material of the hole-transporting luminescent layer 4a (first fluorescent material) and the fluorescent material of the electron-transporting luminescent layer 4b (second fluorescent material) emit light simultaneously. Each of these first and second fluorescent materials comprises at least two kinds of fluorescent materials so that the emission spectrum of the luminescent color from the hole-transporting luminescent layer 4a approximately conforms with that from the electron-transporting luminescent layer 4b.

In order to bring the emission spectrum of the luminescent color emitted from the hole-transporting light emission layer 4a into substantial conformity with the emission spectrum of the luminescent color emitted from the electron-transporting luminescent layer 4b, the first and second fluorescent materials comprise preferably respectively two or more the same kinds of fluorescent materials having the same concentration ratios.

The fluorescent materials used are not limited, in particular. Examples of the blue type fluorescent materials (having a fluorescent peak wavelength of 380 nm to less than 510 nm under the solid state) are perylene (see FIG. 4.) and tetraphenylbutadiene (TPB). Examples of orange or red type fluorescent materials (having a fluorescent peak wavelength of 480 nm to less than 700 nm under the solid state) are 4-(dicyanomethylene)-2-methyl-6-(p-dimethylaminostyryl)-4H-pyran (DCM1; see FIG. 4), Nile Red and an europium complex.

The fluorescent material as the dopant of each luminescent layer 4a, 4b has a fluorescent peak wavelength that is equal to, or longer than, the fluorescent peak wavelength of the hole-transporting material of the hole-transporting luminescent layer 4a under the solid state and that of the electron-transporting material of the electron-transporting luminescent layer 4b under the solid state.

Figure 5:
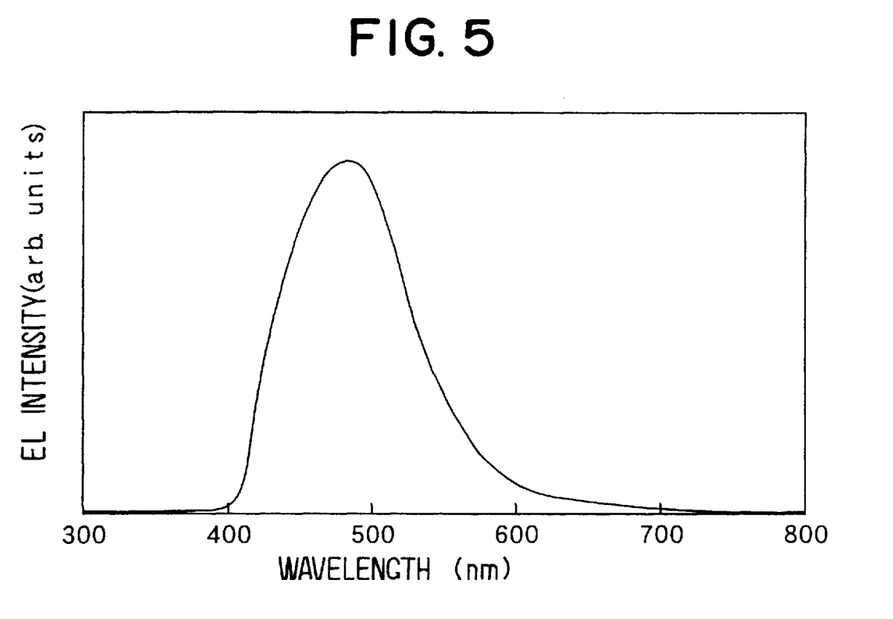
FIG. 5 is a chart showing an emission spectrum of benzo-oxadiazoleferrite-zinc complex (ZnBOX)

The term "fluorescent peak under solid state" used in this embodiment embraces a band spectrum having a certain width even though the peak is not a distinct peak (line spectrum). FIG. 5 shows the emission spectrum of ZnBOX described above as an example of such a band spectrum.

Figure 3:
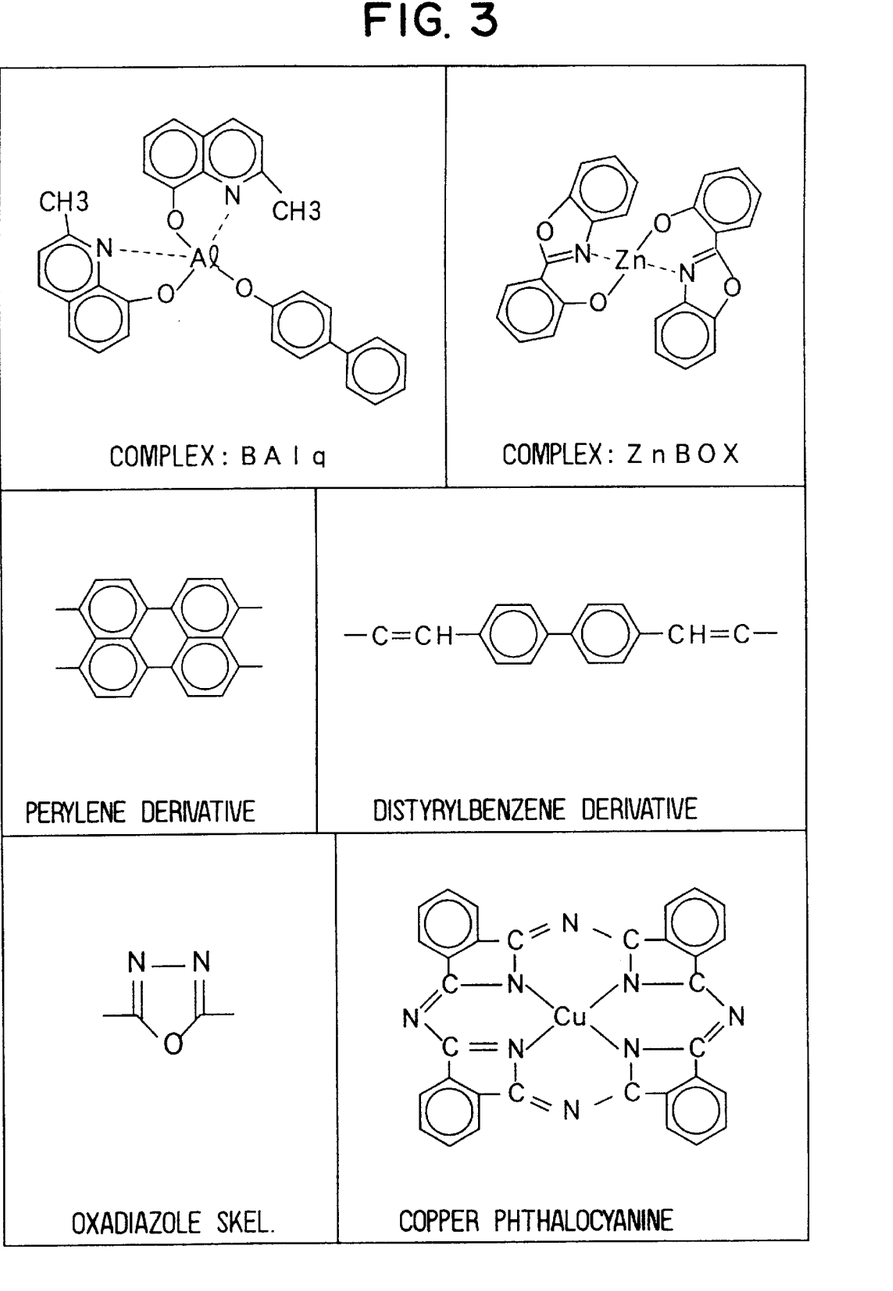

An electron injection layer 5, that is made of an organic material having an electron-transporting (electron-injecting) property, is formed on the light emission layer 4 or in other words, on the electron-transporting light emission layer 4b. The thickness of the layer 5 is about 10 nm to 100 nm and preferably, about 50 nm. This material is not limited, in particular, so long as it has the electron-transporting property. For example, it may be the metal complex materials, the materials having the oxadiazole skeleton, the perylene derivatives or the distyrylbenzene derivatives that are shown in FIG. 3.

The cathode 6 is formed by lamination on the electron injection layer 5 and its thickness is about 100 nm to 1 $\mu$m. A two-layered structure of LiF/Al or Li$_2$O/Al or a mixed layer of metallic atoms such as Mg and Ag or Al and Li can be used as the material for the cathode 6. In this way, the EL element 100 has the structure in which the luminescent layer 4 is sandwiched between a pair of electrodes 2 and 6 through the injection layers 3 and 5, respectively, on the substrate 1.

To smoothly inject holes from the anode 2 into the hole injection layer 3, it is preferred to bring the conduction band minimum level of the hole injection layer 3 close to the ionization potential of the anode 2. The ionization potential of the anode 2 can be changed, for example, when cleansing by ultraviolet rays (UV) is performed to the surface of the anode 2 made of ITO. It is also possible that the hole injection layer 3 is formed to have two or more layers and the layer contacting the anode 2 is made of a material having a conduction band minimum level close to the ionization potential of the anode 2. A material having a tolylamine skeleton (see FIG. 2) or copper phthalocyanine (see FIG. 3) is preferably used as the material for the layer on the anode side.

Similarly, to smoothly inject electrons from the cathode 6 into the electron injection layer 5, the electron injection layer 5 may be composed of two or more layers of organic materials. In this case, a material having a high electron-transporting property is preferably used as the material for the layer contacting the cathode 6, i.e., on the cathode side. For example, an aluminum-quinolynol complex is preferably used as the material of the layer on the cathode side. The base materials (hole-transporting material) of the hole injection layer 3 and the hole-transporting luminescent layer 4a, and the base materials (electron-transporting material) of the electron injection layer 5 and the electron-transporting luminescent layer 4b may be the same, respectively.

The EL element 100 having the structure described above can be produced by laminating serially the anode 2, the hole injection layer 3, the hole-transporting luminescent layer 4a, the electron-transporting luminescent layer 4b, the electron injection layer 5 and the cathode 6 in this order on the substrate 1 by known-methods such as vacuum deposition or sputtering. Incidentally, the hole-transporting luminescent layer 4a and the electron-transporting luminescent layer 4b, wherein the fluorescent materials are doped into the base materials, can be formed into films by vacuum co-deposition of the base materials and the fluorescent materials.

When a voltage (several to dozens of volts) is applied across the pair of electrodes 2 and 6 of the EL element 100, holes are injected into the hole-transporting luminescent layer 4a from the anode 2 through the hole injection layer 3, and electrons are injected into the electron-transporting luminescent layer 4b from the cathode 6 through the electron injection layer 5.

In this instance, the fluorescent peak wavelength of the base material of each luminescent layer 4a, 4b under the solid state is within the range of 380 nm to less than 510 nm. Therefore, the difference in energy level between the base materials of the layers 4a and 4b is small, and carriers (holes and electrons) migrate and recombine beyond the interfaces of both luminescent layers 4a and 4b, generating thereby excitons.

In the luminescent layers 4a and 4b, the fluorescent peak wavelength of each fluorescent material under the solid state exists in the wavelength region equal to, or longer than, the fluorescent peak wavelength of the base material of each luminescent layer 4a, 4b under the solid state. Therefore, energy of the base material becomes greater than that of the fluorescent material. Consequently, energy of excitons, the magnitude of which depends on the base materials, migrates inside the same luminescent layer or into the other luminescent layer beyond the interface of the luminescent layer 4, 4b, and is so transmitted, with respect to each fluorescent material having energy equal to, or smaller than energy of excitons.

Each fluorescent material in the luminescent layers 4a and 4b receives energy from excitons, and emits light with the luminescent color that corresponds to the fluorescent peak wavelength under the solid state thereof, simultaneously with each other. In other words, the first fluorescent material emits light in the hole-transporting luminescent layer 4b and the second fluorescent material simultaneously emits light in the electron-transporting luminescent layer 4b. The luminescent color of the EL element is a mixed color of the luminescent colors of two or more kinds of fluorescent materials in the first and second fluorescent materials.

Thus, when an electric field is applied to the EL element in this embodiment, holes can be injected from the anode 2 or from the hole injection layer 3, and electrons can be injected from the cathode 6 or from the electron injection layer 5. In other words, the EL element has an injection function capable of injecting holes and electrons, a transportation function of migrating the injected carriers (holes and electrons) by the force of the electric field and a light emission function of providing the recombination site to the electrons and the holes to induce light emission. Incidentally, the degree of easiness of electron injection may be different from that of holes.

In order to have the luminescent colors, from the luminescent layers 4a and 4b simultaneously emitting light, recognized as the mixed color, this embodiment has the feature in that each of the first and second fluorescent materials of the hole-transporting luminescent layer 4a and the electron-transporting luminescent layer 4b comprises two or more kinds of fluorescent materials so that the emission spectrum of the luminescent color emitted from the hole-transporting luminescent layer 4a approximately conforms with the emission spectrum of the luminescent color emitted from the electron-transporting luminescent layer 4b.

More specifically, this means that if the luminescent color emitted from the hole-transporting luminescent layer 4a is of a red color type, the luminescent color emitted from the electron-transporting luminescent layer 4b, too, is of the red color type, and if the luminescent colors of the luminescent layers 4a and 4b are of the same color type, the emission spectra of the luminescent layers 4a and 4b exit at approximately the same level.

As to the white color having the severest color change, for example, the change of chromaticity can be regarded as being substantially absent when the chromaticity change on both X and Y coordinates is about 0.03 or below in ordinary display devices. In this embodiment, the expression that emission spectrum of the luminescent color emitted from the hole-transporting luminescent layer 4a approximately conforms with the emission spectrum of the luminescent color emitted from the electron-transporting luminescent layer 4b, means such a level.

According to the present embodiment that satisfies the level described above, even when the supply balance of electrons and holes in the hole-transporting and electron-transporting luminescent layers 4a and 4b collapses, the luminescent colors of these luminescent layers 4a and 4b are approximately the same color, and the chromaticity change of the mixed color by both luminescent layers 4a and 4b hardly occurs. In consequence, this embodiment can prevent the chromaticity change of the luminescent color with the change of the applied current value and with the elapsed light emission time.

Figure 6:
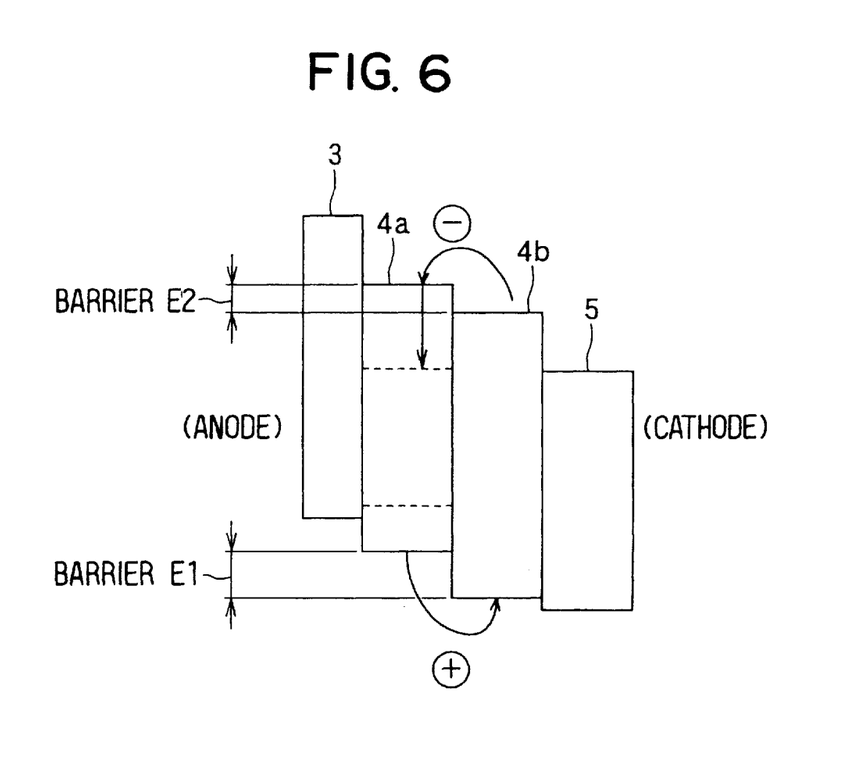
FIG. 6 is an energy diagram of a laminated luminescent layer type organic EL element.

Such effects of this embodiment will be explained in more detail with reference to FIG. 6. The drawing shows an energy diagram in the laminated luminescent layer type organic EL element. It will be first assumed that the hole-transporting layer 4a is a red color luminescent layer and the electron-transporting luminescent layer 4b is a blue color luminescent layer, for example, in conventional elements. In this case, electrons (indicated by − sign encircled by white circle in FIG. 6) move from the cathode through the electron injection layer 5 into the electron-transporting luminescent layer (blue color luminescent layer) 4b and further into the hole-transporting luminescent layer (red color luminescent layer) 4a.

Holes (indicated by + sign encircled by white circle in FIG. 6) move from the anode into the hole injection layer 3 and then into the electron-transporting luminescent layer (blue color luminescent layer) 4b through the hole-transporting luminescent layer (red color luminescent layer) 4a. The holes and the electrons recombine in both blue and red color luminescent layers 4a and 4b and emit light from the respective luminescent layers. As a result, white color is obtained as a mixed color of the colors from both luminescent layers.

In this instance, at the interface between the hole-transporting luminescent layer (red color luminescent layer) 4a and the electron-transporting luminescent layer (blue color luminescent layer) 4b, there is a difference between a barrier (energy barrier) E1 through which holes are injected from the hole-transporting luminescent layer 4a into the electron-transporting luminescent layer 4b and a barrier (energy barrier) E2 through which electrons are injected from the electron-transporting luminescent layer 4b into the hole-transporting luminescent layer 4a.

If the barrier E1 is larger than the barrier E2, for example, electrons are more easily injected than holes from the electron-transporting luminescent layer 4b into the hole-transporting luminescent layer 4a. In the case of a low voltage, therefore, light emission in the hole-transporting luminescent layer 4a can be obtained sufficiently whereas light emission in the electron-transporting luminescent layer 4b becomes insufficient, so that the resulting color is somewhat reddish white.

When a voltage is increased to attain a higher current, the difference between easiness of injection of holes and that of electrons hardly exists irrespective of the difference between the barriers E1 and E2, and a greater quantity of holes are injected into the hole-transporting luminescent layer 4a than that at the low voltage. As a result, light emission in the electron-transporting luminescent layer 4b becomes relatively greater. For this reason, the resulting color is white containing blue in a higher intensity than that at the low voltage.

As described above, when the current value changes and the supply balance of electrons and holes collapses in the laminated luminescent layer type organic EL element according to the prior art, the luminescence quantities of the hole-transporting luminescent layer 4a and the electron-transporting luminescent layer 4b having mutually different luminescent colors change, and the chromaticity change occurs in the mixed color of both luminescent layers 4a and 4b.

In this case, it would be possible to prevent the chromaticity change by simply changing the balance of the barriers E1 and E2. However, the barriers E1 and E2 are mainly determined by the base materials of the hole-transporting luminescent layer 4a and the electron-transporting luminescent layer 4b, respectively. These base materials cannot be changed flexibly from the aspect of the hole injecting property, the electron transporting property, chemical stability, and so forth.

In this point, even when the difference exists between the barriers E1 and E2 for electrons and holes at the interface between the hole-transporting and electron-transporting luminescent layers 4a and 4b, in this embodiment, the luminescent colors of these luminescent layers 4a and 4b are approximately the same. This is because the luminescent colors of the hole-transporting and electron-transporting luminescent layers 4a and 4b are approximately the same. Therefore, even when the supply balance of the electron and the hole collapses, this embodiment can prevent the chromaticity change of the luminescent colors resulting from the change of the current value and from the passage of the light emission time.

According to the preferred embodiment of the present invention, further, the first fluorescent material of the hole-transporting luminescent layer 4a and the second fluorescent material of the electron-transporting luminescent layer 4b are made of two or more kinds of fluorescent materials having the same concentration ratio.

Therefore, even when the current value between the pair of electrodes 2 and 6 changes, or when the supply balance of electrons and holes in the luminescent layers 4a and 4b changes after light emission is continued for a long time, the luminescent colors of the fluorescent materials in the luminescent layers 4a and 4b change substantially in the same way. Consequently, the preferred embodiment of this invention can prevent more reliably the chromaticity change resulting from the change of the current value and from the passage of the light emission time.

In this embodiment, the fluorescent peak wavelength of the base material under the solid state in each luminescent layer 4a, 4b exists in the same wavelength region or in the shorter wavelength region as that of the fluorescent materials as described above. Therefore, energy of excitons produced in each luminescent layer 4a, 4b can be easily transmitted from the base material to the fluorescent material inside each luminescent layer, and simultaneous light emission of the fluorescent materials in both luminescent layers 4a and 4b can be conducted efficiently.

According to this embodiment, the fluorescent peak wavelength of the base material of each luminescent layer 4a, 4b under the solid state can be set to the range of 380 nm to less than 510 nm, that is, to the range of the blue color wavelength region of the ordinary EL elements. Therefore, the energy levels of the luminescent layers 4a and 4b can be set to a substantially equal level, and holes and electrons can more easily move into the luminescent layers 4a and 4b beyond their interface. consequence, simultaneous light emission of both luminescent layers becomes possible.

Further, the fluorescent peak wavelength of the base material of each luminescent layer 4a, 4b under the solid state is set to the blue color wavelength region, which is on the shortest wavelength side in the visible light region. For this reason, the fluorescent materials can be selected arbitrarily from each color region of blue, green and red, that is, from the entire visible light region. In other words, not only the white color but also an arbitrary color in the visible light region can be displayed as the synthesized luminescent color when the kind and the concentration ratio of the fluorescent materials in each luminescent layer 4a, 4b are changed appropriately.

In this embodiment, the fluorescent material is preferably contained in the amount falling within a range of 0.1 to 10 wt % on the basis of the base material in each luminescent layer 4a, 4b for the following reason. When the amount of the fluorescent material exceeds 10 wt %, concentration extinction develops. The term "concentration extinction" means the phenomenon in which the fluorescent materials associate with one another at the molecular level as the amount of the fluorescent materials becomes too great, offset energy of excitons, and eventually make it impossible to utilize this energy for emission.

When the amount of the fluorescent material is less than 0.1 wt %, the concentration of the fluorescent material becomes so small that light emission is effected not only from the fluorescent material but also from the base material, so that an arbitrary display color (white, for example) cannot be obtained by the synthesized luminescent color of each fluorescent material as described above. In this embodiment, the luminescent colors of the fluorescent materials are changed arbitrarily so as to cover the luminescent colors of the visible light region. Therefore, it is not preferred that the luminescent color of the base material becomes predominant. In ordinary EL elements in general, since energy conversion efficiency of the base material to light is lower than that of the fluorescent material, light emission with high brightness cannot be acquired.

Figure 7A:
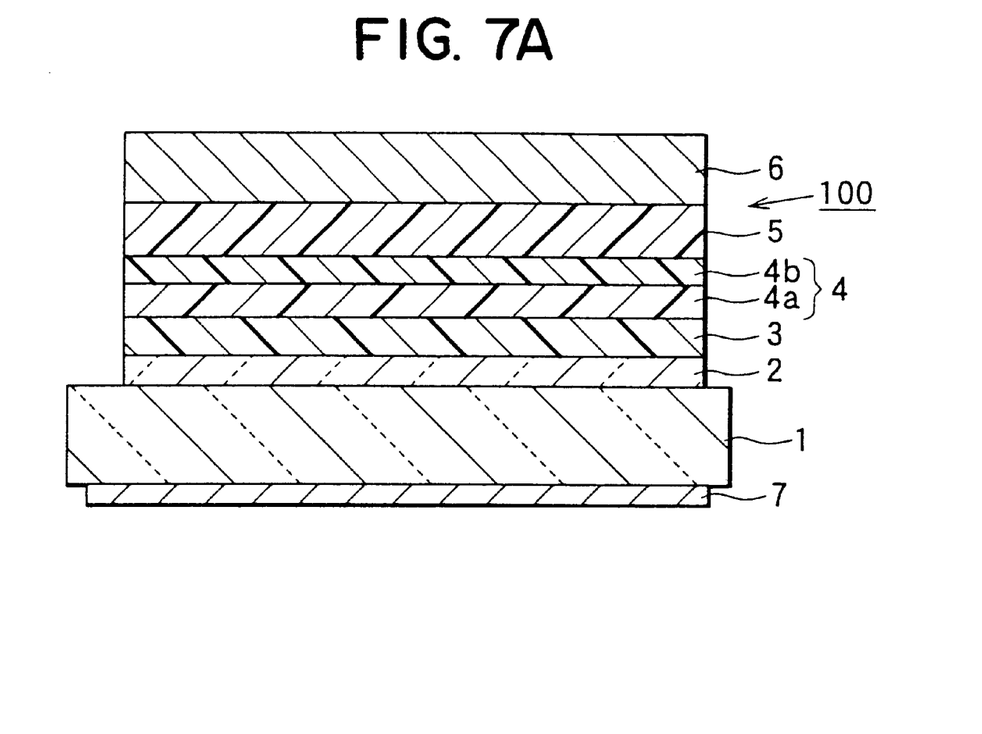
FIGS. 7A and 7B are cross-sectional views showing modified EL elements of the preferred embodiment.
Figure 7B:
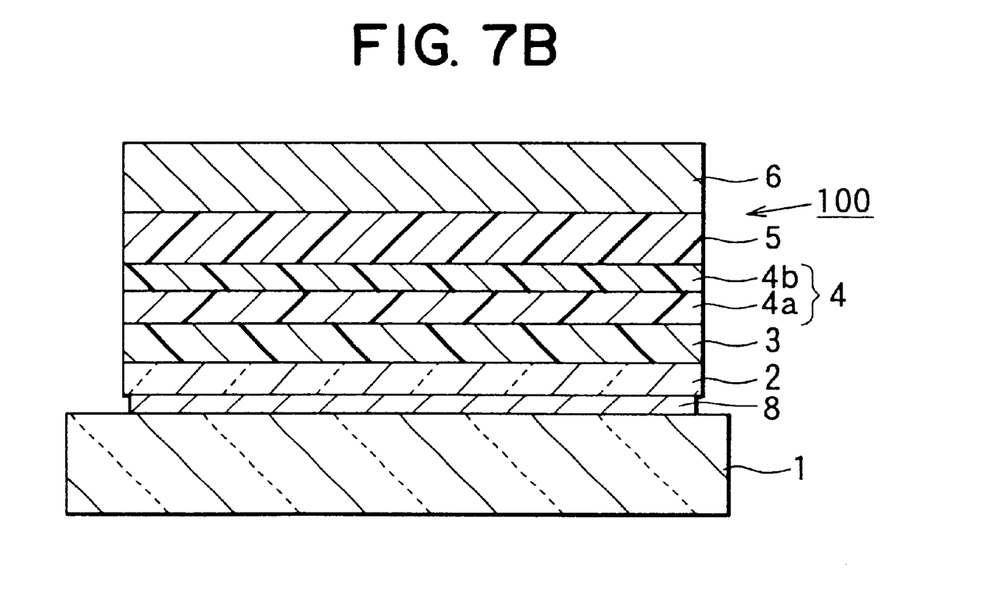

FIG. 7A shows a modified embodiment of this embodiment. As shown in this drawing, a polarizing filter 7 is disposed on the surface of the substrate 1 at the visual field side to prevent external rays of light incident from the visual field direction from being reflected by the cathode (upper electrode) 6. In consequence, the contrast of the element becomes higher, and the visibility can be improved. As shown in FIG. 7B, it is also possible to interpose a layer 8 comprising a color filter or a color conversion layer capable of executing color conversion, between the substrate 1 and the anode 2. Accordingly, multi-color display can be performed.

In the present embodiment, each fluorescent peak wavelength of the fluorescent materials constituting the first and second fluorescent materials under the solid state is set to the same wavelength region or a longer wavelength region than those of the hole-transporting material and the electron-transporting materials under the solid state. In this way, the fluorescent peak wavelengths of the hole-transporting and electron-transporting materials under the solid state can be set to the green color wavelength region or the red wavelength color region. In these cases, the luminescent colors of the fluorescent materials are limited within the visible light region, but the recombination of carriers is carried out through the interface between the luminescent layers and simultaneous light emission becomes possible.

Next, the present invention will be explained more concretely with reference to the following examples that are merely illustrative but in no way restrictive.

EXAMPLE 1

This example employs the following structure on the basis of the EL element 100 shown in FIG. 1. An anode 2 comprising an ITO film was formed with a thickness of about 150 nm on a glass substrate 1. A hole-transporting material as the base material of both hole injection layer 3 and hole-transporting luminescent layer 4a comprises α-NPD (see FIG. 4; conduction band minimum level: −2.4 eV, valence band maximum level: −5.4 eV, fluorescent peak wavelength under solid state in a range of 400 nm to less than 500 nm).

Figure 4:
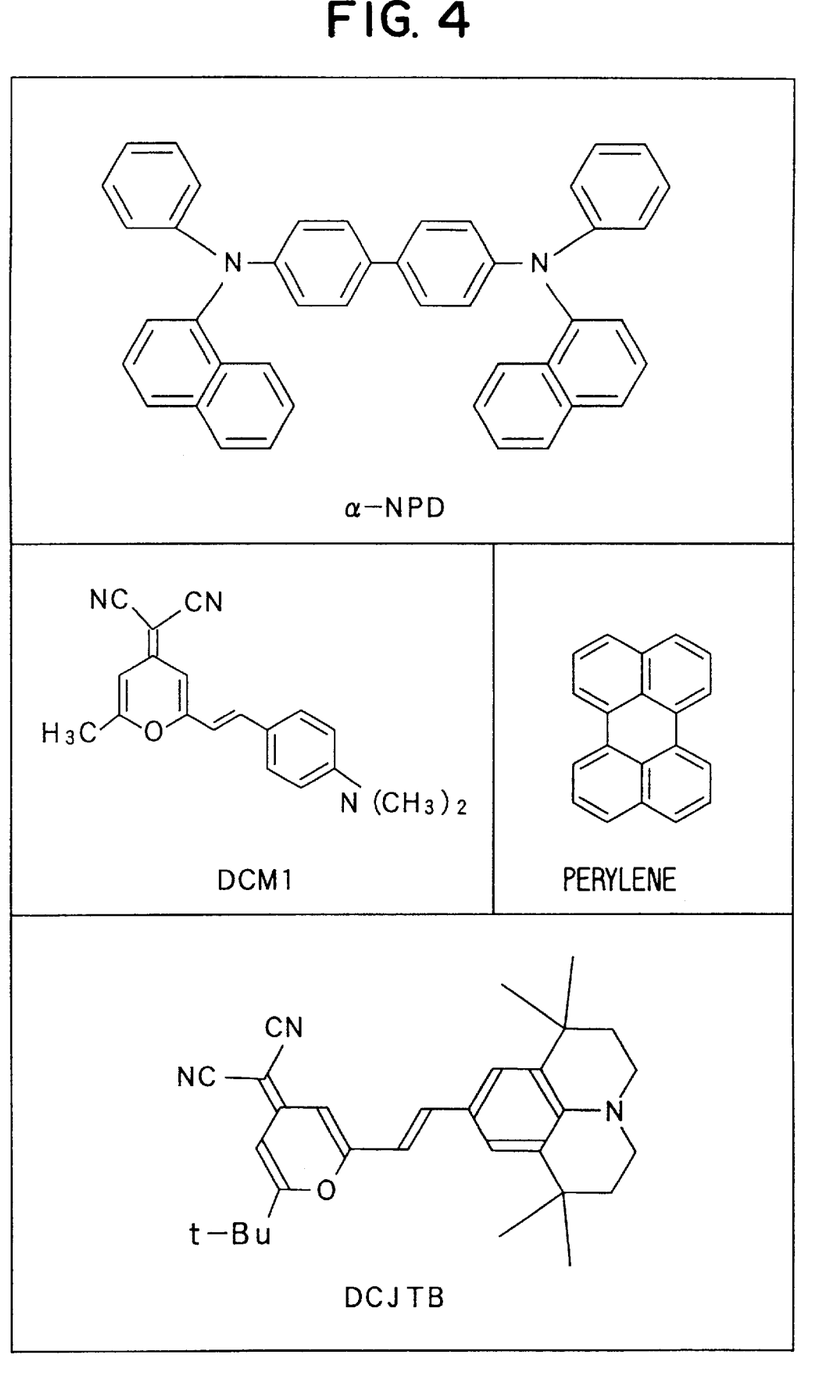

A fluorescent material (first fluorescent material) as a dopant of the hole-transporting luminescent layer 4a comprises perylene (see FIG. 4; conduction band minimum level: −2.75 eV, valence band maximum level: −5.5 eV, fluorescent peak wavelength under solid state in a range of 450 nm to less than 460 nm), and DCM1 (see FIG. 4; conduction band minimum level: −3.5 eV, valence band maximum level: −5.4 eV, fluorescent peak wavelength under solid state in a range of 570 nm to less than 610 nm).

To the hole-transporting luminescent layer 4a are doped perylene in a concentration of 1 wt % and DCM1 in a concentration of 0.25 wt %. The thickness of the hole injection layer 3 is about 20 nm and the thickness of the hole-transporting luminescent layer 4a is about 20 nm, too.

An electron-transporting material as a base material of each of an electron injection layer 5 and an electron-transporting luminescent layer 4b comprises benzoxazole ferrite-zinc complex (ZnBOX, see FIG. 3; conduction band minimum level: −2.9 eV, valence band maximum level: −5.8 eV, fluorescent peak wavelength under solid state in a range of 400 nm to less than 480 nm).

A fluorescent material (second fluorescent material) as a dopant of the electron-transporting luminescent layer 4b comprises perylene and DCM1 in the same way as the first fluorescent material described above, and they are doped in concentrations of 1 wt % and 0.25 wt %, respectively, to the electron-transporting luminescent layer 4b. The thickness of the electron-transporting luminescent layer 4b is about 5 nm and the thickness of the electron injection layer 5 is about 55 nm.

In this example, light emission of 450 nm by perylene as the fluorescent material and light emission of 580 nm by DCM1 as the fluorescent material in the hole-transporting luminescent layer 4a and the electron-transporting luminescent layer 4b are performed simultaneously, so that white color emission as their synthesized light is attained at the chromaticity coordinates (0.320, 0.350) having high color purity. This element can provide high brightness of 5,000 cd/m$^2$ at 10 V as light emission characteristics.

Figure 8:
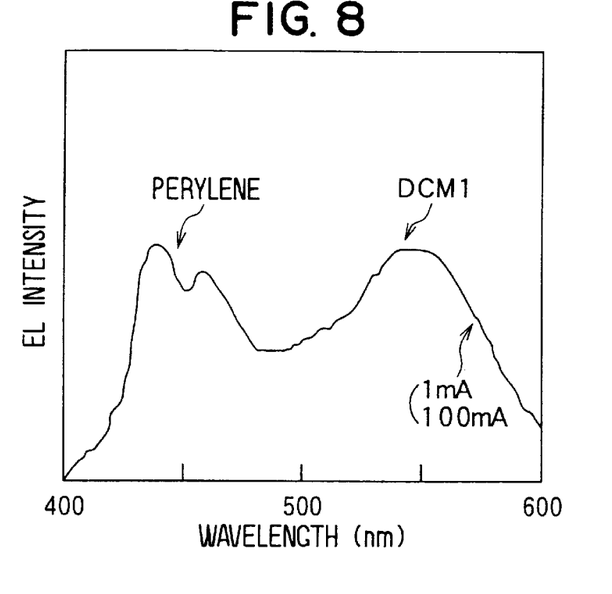
FIG. 8 is a chart showing an emission spectrum exhibiting a chromaticity change preventive effect in Example 1.

This example can prevent the chromaticity change resulting from the change of the current value and from the passage of the light emission time. FIG. 8 shows an example of the effect when the current value is changed. Even when the current value between the pair of electrodes 2 and 6 is changed to 1 mA and 100 mA, the peak intensity of each of perylene and DCM1 remain unchanged, and the chromaticity change of the luminescent color can be prevented.

EXAMPLE 2

It is also possible to use three or more kinds of fluorescent materials as a fluorescent material in each luminescent layer, such as an organic compound having a fluorescent peak wavelength in a range of 380 nm to less than 510 nm under the solid state, an organic compound having a fluorescent peak wavelength in a range of 480 nm to less than 550 nm under the solid state and an organic compound having a fluorescent peak wavelength in a range of 540 nm to less than 700 nm under the solid state. This example represents an example of such a case, and the difference from Example 1 will be described mainly.

The hole transporting material as the base material of each of the hole injection layer 3 and the hole-transporting luminescent layer 4a comprises α-NPD (see FIG. 4) described above. The electron-transporting material as the base material of each of the electron injection layer 5 and the electron-transporting luminescent layer 4b comprises ZnBOX (see FIG. 3) described also above. In each of the luminescent layers 4a and 4b, 1 wt % of perylene as the blue type fluorescent material (see FIG. 4), 0.8 wt % of dimethylquinacridone as the green type fluorescent material and 0.2 wt % of DCJTB as the red type fluorescent material (see FIG. 4) are doped.

According to this example, the three kinds of the fluorescent materials described above emit light simultaneously in each of the hole-transporting luminescent layer 4a and electron-transporting luminescent layer 4b. As a result, light emission of while color as a synthesized color can be obtained by light emission of 450 nm by perylene, light emission of 530 nm by dimethylquinacridone and light emission of 630 nm by DCJTB. This example can also prevent the chromaticity change of the luminescent color resulting from the change of the current value

EXAMPLE 3

Figure 9:
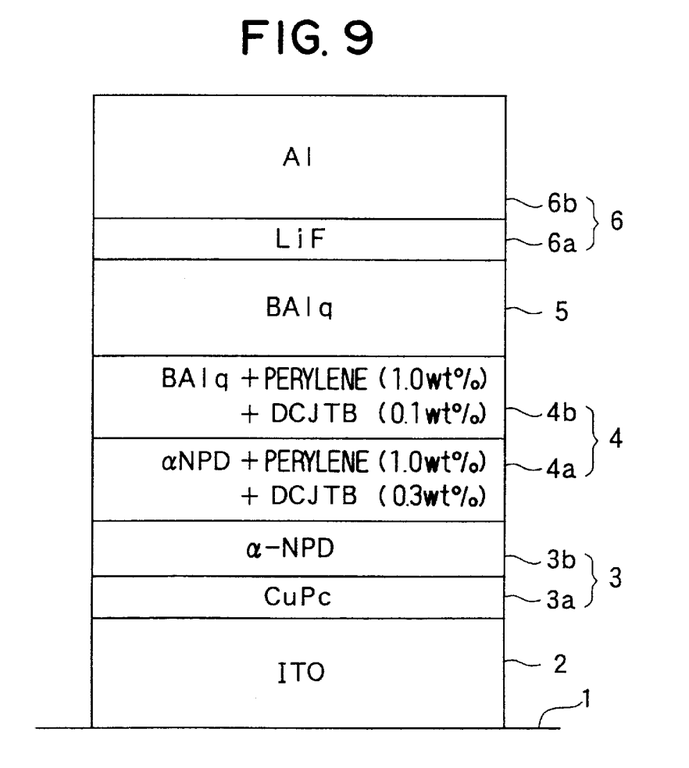
FIG. 9 is a schematic cross-sectional view showing an organic EL element in Example 3.

FIG. 9 shows a schematic cross-section of an EL element according to this example. Compared to the structure of the EL element 100 shown in FIG. 1, in the EL element shown in FIG. 9, a hole injection layer 3 is composed of a layer 3b made of α-NPD on a side of a hole-transporting luminescent layer 4a and a layer 3a made of copper phthalocyanine (CuPc; see FIG. 3) on a side of an anode 2, and a cathode 6 is composed of a layer 6a made of LiF on a side of an electron injection layer 5 and a layer 6b made of Al and formed on the layer 6a.

In FIG. 9, the anode 2 made of ITO is formed with a thickness of about 140 nm on a glass substrate 1. In the hole injection layer 3, on the other hand, the layer 3a is formed with a thickness of 15 nm and the layer 3b is formed with a thickness of 25 nm.

The hole-transporting material as the base material of the hole-transporting luminescent layer 4a comprises (α-NPD, and the fluorescent material (first fluorescent material) as the dopant of the hole-transporting luminescent layer 4a comprises perylene and DCJTB. To the hole-transporting luminescent layer 4a are doped 1 wt % of perylene and 0.3 wt % of DCJTB. Incidentally, the thickness of the hole-transporting luminescent layer 4a is 15 nm.

The electron-transporting material as the base material of both electron injection layer 5 and electron-transporting luminescent layer 4b comprises BAlq (see FIG. 3). The fluorescent material (second fluorescent material) as the dopant of the electron-transporting luminescent layer 4b comprises perylene and DCJTB in the same way as the first fluorescent material described above, and 1 wt % of perylene and 0.1 wt % of DCJTB are doped into the electron-transporting luminescent layer 4b.

The thickness of the electron-transporting luminescent layer 4b is 20 nm and that of the electron injection layer 5 is 40 nm. The thickness of the LiF layer 6a in the cathode 6 on the side of the electron injection layer 5 is 0.5 nm, and the thickness of the Al layer 6b on the former is 100 nm.

Figure 10:
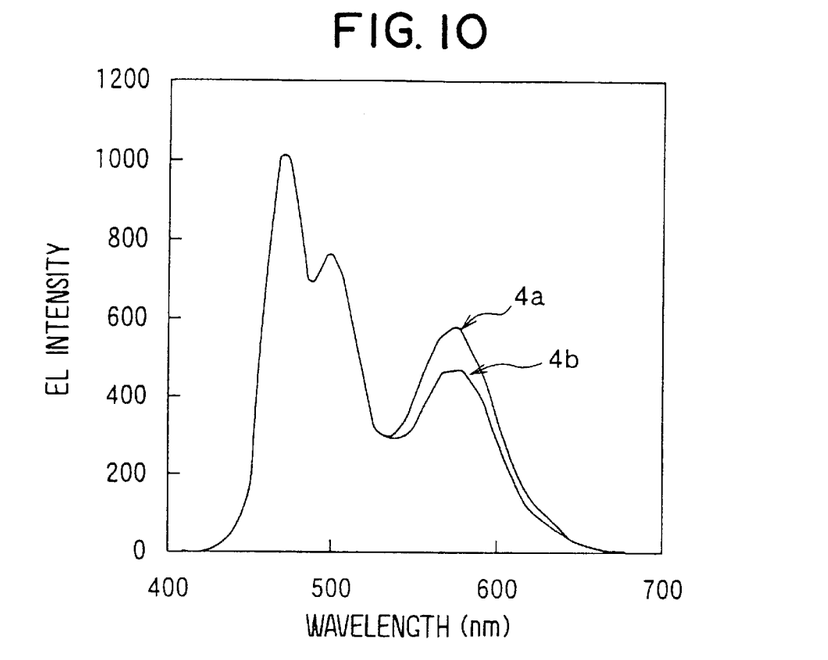
FIG. 10 is a chart showing emission spectra of a hole-transporting luminescent layer and an electron-transporting luminescent layer in Example 3.

FIG. 10 shows the emission spectra of these hole-transporting luminescent layer 4a and electron-transporting luminescent layer 4b. Both luminescent layers 4a and 4b provide the light emission peak of about 450 nm by perylene and the light emission peak of about 580 nm by DCJTB. In other words, the emission spectra emitted from the hole-transporting luminescent layer 4a and emitted from the electron-transporting luminescent layer 4b are almost the same.

Particularly because DCJTB of the red color type (orange) is relatively small in the hole-transporting luminescent layer 4a, the luminescent color is a white color with somewhat a bluish color. Because DCJTB is relatively great in the electron-transporting luminescent layer 4b, on the other hand, the luminescent color is a white color with a somewhat yellowish color. The luminescent colors from both luminescent layers 4a and 4b are thus the same white color type. As the synthesized color of these colors, there could be obtained white color emission having high color purity by the simultaneous emission of the hole-transporting luminescent layer 4a and the electron-transporting luminescent layer 4b.

Figure 11:
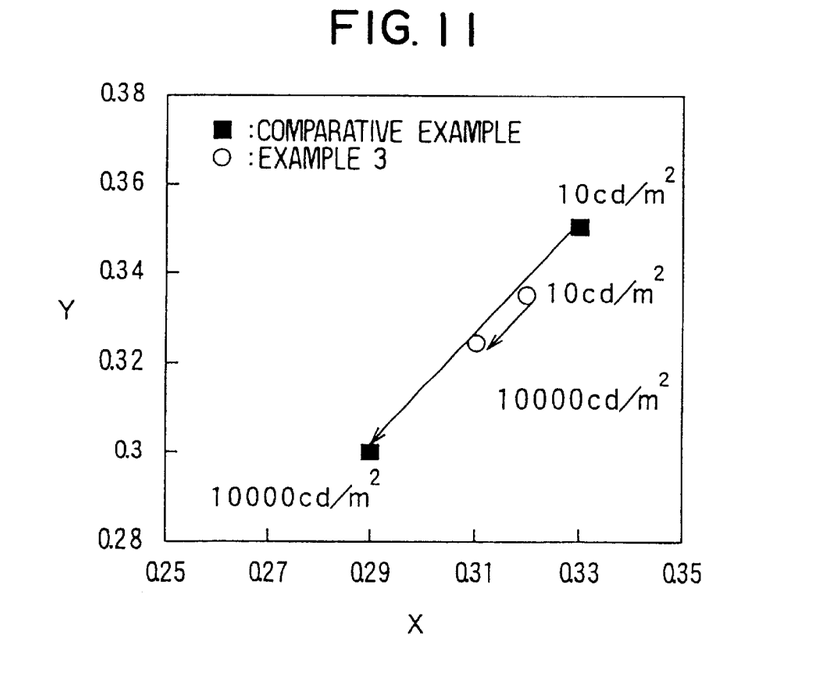
FIG. 11 is a graph showing chromaticity changes of Example 3 and a comparative example, with respect to a brightness change.

FIG. 11 shows chromaticity changes in this Example 3 and in a later-appearing comparative example with respect to a brightness change (that is, a change in current). The abscissa represents X of the chromaticity coordinates and the ordinate represents Y of the chromaticity coordinates. In this example, white color emission having high color purity of the chromaticity coordinates (0.32, 0.335) could be obtained when the brightness was 10 cd/m$^2$ (applied current: 0.3 mA/cm$^2$). Even when the brightness was 10,000 cd/m$^2$ (applied current: 100 mA/cm$^2$), white color emission having high color purity of the chromaticity coordinates (0.31, 0.325) could be obtained.

As described above, this example can suppress the chromaticity change of luminescent color to (0.01, 0.01) when brightness (current) is changed, and can achieve the chromaticity coordinate change of 0.03 or below at which the chromaticity change render no problem in display devices in general.

EXAMPLE 4

In this example, the difference of the structure Example 3 will be described. The hole-transporting luminescent layer 4a contains (α-NPD as the base material, and 1 wt % of perylene and 0.2 wt % of DCJTB as the first fluorescent material. The electron-transporting material as the base material of both the electron injection layer 5 and the electron-transporting luminescent layer 4b comprises ZnBOX (see FIG. 3).

The second fluorescent material in the electron-transporting luminescent layer 4b comprises perylene and rubrene, and they are doped in the amount of 1 wt % and 0.3 wt %, respectively, into the electron-transporting luminescent layer 4b. The rest of the constitutions are the same as those of Example 3. According to this example, the hole-transporting luminescent layer 4a provide white color light emission of the chromaticity coordinates (0.30, 0.31) and the electron-transporting luminescent layer 4b provide white color light emission of the chromaticity coordinates (0.32, 0.34).

Figure 12:
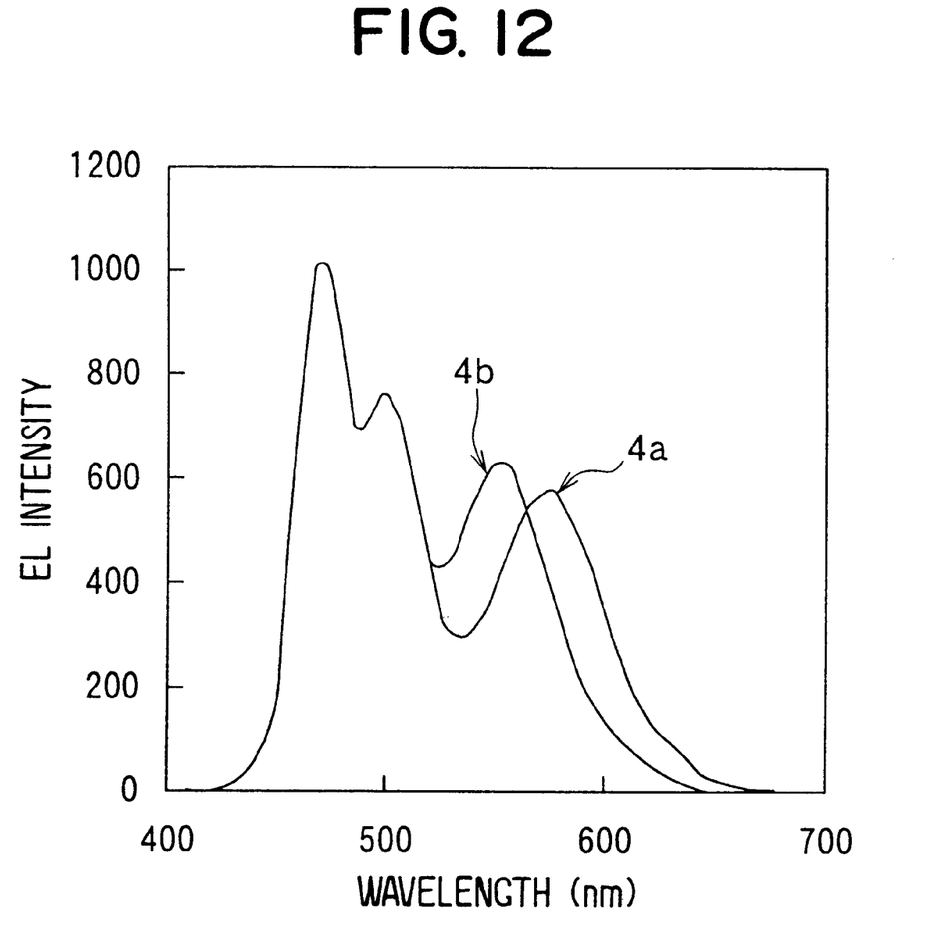
FIG. 12 is a chart showing emission spectra of a hole-transporting luminescent layer and an electron-transporting luminescent layer in Example 4.

In other words, the luminescent color of DCJTB (orange type) in the first fluorescent material was strictly different from the luminescent color of rubrene (yellow type) in the second fluorescent material in this example, but the emission spectrum of the luminescent color emitted from the hole-transporting luminescent layer 4a and the emission spectrum of the luminescent color emitted from the electron-transporting luminescent layer 4b are approximately the same as each other. Therefore, the luminescent colors from both luminescent layers 4a and 4b can be made the same white color type.

FIG. 12 shows the emission spectrum of the hole-transporting luminescent layer 4a and that of the electron-transporting luminescent layer 4b. The light emission peak of about 450 nm by perylene as the fluorescent material and the light emission peak of about 580 nm by DCJTB as the fluorescent material could be obtained from the hole-transporting luminescent layer 4a. On the other hand, the light emission peak of about 450 nm by perylene as the fluorescent material and the light emission peak of about 550 nm by rubrene as the fluorescent material could be obtained from the electron-transporting luminescent layer 4b.

Light emission of white color as a synthesized color having high color purity could be obtained by simultaneous light emission from the hole-transporting luminescent layer 4a and the electron-transporting luminescent layer 4b. In this example, too, the chromaticity change of the luminescent color, when brightness is changed in the same way as in Example 3, can be restricted to the change within chromaticity of the luminescent color from both luminescent layers 4a and 4b, that is, to (0.02, 0.03). In this way, this example can suppress the chromaticity change to the chromaticity coordinate change of 0.03 or less at which the chromaticity change is believed to render no problem in display devices in general.

Comparative Example

In the comparative example, the fluorescent material in the hole-transporting luminescent layer 4a comprises solely perylene (addition amount: 1 wt %), and the fluorescent material in the electron-transporting luminescent layer 4b comprises solely rubrene (addition amount: 0.3 wt %). The rest of the constitutions are substantially the same as those of Example 4.

In this comparative example, when brightness is changed between 10 cd/m$^2$ (applied current: 0.3 mA/cm$^2$) and 10,000 cd/m$^2$ (applied current: 100 mA/cm$^2$), the chromaticity coordinates change between (0.33, 0.35) and (0.29, 0.30) as shown in FIG. 11. When brightness (applied current) is changed, the chromaticity of the luminescent color changes to (0.04, 0.05).

As described above, this example generates a greater chromaticity change than the chromaticity coordinate change of 0.03 at which the chromaticity change is believed to render no problem in display devices in general, and can not prevent the chromaticity change.

According to the embodiment of the present invention, simultaneous light emission of two or more colors is possible without disposing the carrier recombination region control layer that has been necessary in the prior art element. In consequence, the present invention can acquire multi-color (inclusive of white color) light emission with high efficiency and high controllability. However, the laminated light emission layer type EL element to which the present invention is applied may have the carrier recombination region control layer between the hole-transporting luminescent layer and the electron-transporting luminescent layer as disclosed in Japanese Patent Laid-Open No. 8-78163.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An organic EL element comprising:
   an anode;
   a cathode; and
   an organic luminescent layer located between the anode and the cathode, the organic luminescent layer including:
   a hole-transporting luminescent layer that includes a hole-transporting base material doped with a first fluorescent material, which includes at least two different fluorescent substances, such that the hole-transporting layer emits a spectrum of mixed light, wherein the hole-transporting layer is provided with a supply of holes; and
   an electron-transporting luminescent layer that includes an electron-transporting base material doped with a second fluorescent material, which includes at least two different fluorescent substances, such that the electron-transporting material emits a spectrum of mixed light, wherein the electron-transporting layer is provided with a supply of electrons, and wherein the spectrum of the electron-transporting layer is substantially the same as the spectrum of the hole-transporting layer even if the supply of holes and the supply of electrons become unbalanced, such that the EL has substantially constant chromaticity, and wherein the hole-transporting luminescent layer directly contacts the electron-transporting luminescent layer, and the fluorescent peak wavelengths of the hole-transporting luminescent layer and the electron-transporting luminescent layer under a solid state are in a range of 380 nm to less than 510 nm.

2. The organic EL element according to claim 1, wherein the hole-transporting luminescent layer and the electron-transporting luminescent layer emit light simultaneously.

3. The organic EL element according to claim 1, wherein each fluorescent substance has a solid state peak wavelength, and each base material has a solid state peak wavelength, and the solid state wavelength of each fluorescent material is equal to or greater than that of the corresponding base material.

4. The organic EL element according to claim 1, wherein:
the fluorescent substances in the electron-transporting layer are the same substances as the fluorescent substances in the hole-transporting layer, and;
the concentrations of the two fluorescent substances in the electron-transporting layer are the same as the concentrations of the two fluorescent substances in the hole-transporting layer.

5. The organic EL element according to claim 4, wherein the two fluorescent substances are a first fluorescent substance and a second fluorescent substance, and the peak wavelength of the first fluorescent substance is different from that of the second fluorescent substance.

6. The organic EL element according to claim 5, wherein the hole-transporting luminescent layer and the electron-transporting luminescent layer emit light simultaneously.

7. The organic EL element according to claim 5, wherein each fluorescent substance has a solid state peak wavelength, each base material has a solid state peak wavelength, and the solid state wavelength of each fluorescent substance is equal to or greater than that of the corresponding base material.

8. The organic EL element according to claim 5, wherein:
the hole-transporting luminescent layer directly contacts the electron-transporting luminescent layer; and
the solid state fluorescent peak wavelengths of the hole-transporting luminescent layer and the electron-transporting luminescent layer are in a range of 380 nm to less than 510 nm.

9. An organic EL element comprising:
an anode;
a cathode;
a hole-transporting luminescent layer located between the anode and the cathode, wherein the hole-transporting layer is made of a hole-transporting base material doped with a first fluorescent material, which includes at least two different fluorescent substances, such that the hole-transporting layer emits light in a first mixed-color when holes and electrons are supplied by the anode and the cathode; and
an electron-transporting luminescent layer located between the anode and the cathode, wherein the electron-transporting layer is made of an electron-transporting base material doped with a second fluorescent material, which includes at least two different fluorescent substances, such that the electron-transporting material emits light in a second mixed-color when the holes and electrons are supplied, wherein chromaticity coordinates of light emitted from the layers change in accordance with changes in a balance of the supply of holes and electrons, and the variation in either one of an X chromaticity coordinate and a Y chromaticity coordinate is equal to or less than 0.03 despite changes in the balance of the supply of holes and electrons,
and wherein the hole-transporting luminescent layer directly contacts the electron-transporting luminescent layer, and the fluorescent peak wavelengths of the hole-transporting luminescent layer and the electron-transporting luminescent layer under a solid state are in a range of 380 nm to less than 510 nm.

10. The element of claim 9, wherein the first fluorescent material is the same as the second fluorescent material, and the ratio of the concentrations of the fluorescent substances is substantially the same in the first and second fluorescent materials.

11. The organic EL element according to claim 9, wherein each fluorescent substance has a solid state peak wavelength, and each base material has a solid state peak wavelength, and the solid state wavelength of each fluorescent substance is equal to or greater than that of the corresponding base material.

12. At The organic EL element of claim 9, wherein the fluorescent substances of the first fluorescent material and those of the second fluorescent material emit white mixed-color light.

13. The organic EL element of claim 12, wherein the hole-transporting luminescent layer and the electron-transporting luminescent layer are laminated to each other.

* * * * *